United States Patent
Nomoto

(10) Patent No.: US 8,134,182 B2
(45) Date of Patent: Mar. 13, 2012

(54) FIELD-EFFECT TRANSISTOR, SEMICONDUCTOR DEVICE INCLUDING THE FIELD-EFFECT TRANSISTOR, AND METHOD OF PRODUCING SEMICONDUCTOR DEVICE

(75) Inventor: Kazuki Nomoto, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/612,879

(22) Filed: Dec. 19, 2006

(65) Prior Publication Data

US 2007/0138517 A1    Jun. 21, 2007

(30) Foreign Application Priority Data

Dec. 20, 2005  (JP) ................ P2005-367263
Oct. 17, 2006  (JP) ................ P2006-282479

(51) Int. Cl.
H01L 29/76    (2006.01)

(52) U.S. Cl. . 257/194; 257/192; 257/195; 257/E21.401; 257/E21.407; 257/E29.246

(58) Field of Classification Search .......... 438/142, 438/167, 172, 197, 218, 294; 257/192, 244, 257/288, 368, 410, 194, 195, E21.401, E21.407, 257/E29.246
See application file for complete search history.

(56) References Cited

U.S. PATENT DOCUMENTS

| | | | | |
|---|---|---|---|---|
| 5,821,576 A | * | 10/1998 | Sriram | 257/284 |
| 5,925,903 A | * | 7/1999 | Iwanaga et al. | 257/284 |
| 6,294,801 B1 | * | 9/2001 | Inokuchi et al. | 257/192 |
| 6,507,051 B1 | * | 1/2003 | Hara | 257/194 |
| 6,534,790 B2 | * | 3/2003 | Kuzuhara et al. | 257/76 |
| 7,002,189 B2 | * | 2/2006 | Kikkawa | 257/192 |
| 2004/0201038 A1 | * | 10/2004 | Kimura et al. | 257/192 |
| 2006/0220065 A1 | * | 10/2006 | Kawasaki et al. | 257/200 |

FOREIGN PATENT DOCUMENTS

| | | |
|---|---|---|
| JP | 46-1059 | 9/1971 |
| JP | 49-15996 | 2/1974 |
| JP | 53-48273 | 5/1978 |
| JP | 61-112383 | 5/1986 |
| JP | 02-034938 | 2/1990 |
| JP | 03-145139 | 6/1991 |
| JP | 09-107092 | 4/1997 |
| JP | 11-150264 | 6/1999 |
| JP | 2002-313816 | 10/2002 |
| JP | 2003-059947 | 2/2003 |
| JP | 2003-218130 | 7/2003 |
| JP | 2004-55788 | 2/2004 |

OTHER PUBLICATIONS

Japanese Office Action issued on Apr. 30, 2008.
An Office Action for Japanese Patent Application 2006-282479 issued on Sep. 24, 2008.

* cited by examiner

Primary Examiner — Kiesha Bryant
Assistant Examiner — Eric Ward
(74) Attorney, Agent, or Firm — SNR Denton US LLP

(57) ABSTRACT

A field-effect transistor includes a semi-insulating substrate, a source electrode, a drain electrode, a gate electrode, the electrodes being provided on the semi-insulating substrate, and a buried gate region which is provided under the gate electrode and in which an impurity is doped, wherein a concave slit is provided in the semi-insulating substrate, the slit being located between the gate electrode and the drain electrode and being adjacent to the buried gate region at the side of the drain electrode.

9 Claims, 9 Drawing Sheets

FIELD-EFFECT TRANSISTOR, SEMICONDUCTOR DEVICE INCLUDING THE FIELD-EFFECT TRANSISTOR, AND METHOD OF PRODUCING SEMICONDUCTOR DEVICE

CROSS REFERENCES TO RELATED APPLICATIONS

The present invention contains subject matter related to Japanese Patent Application JP 2006-282479 filed in the Japanese Patent Office on Oct. 17, 2006, and Japanese Patent Application JP 2005-367263 filed in the Japanese Patent Office on Dec. 20, 2005, the entire contents of which are incorporated herein by reference.

BACKGROUND OF THE INVENTION

1. Field of the Invention

The present invention relates to a field-effect transistor, a semiconductor device including the field-effect transistor, and a method of producing a semiconductor device.

2. Description of the Related Art

Monolithic microwave integrated circuits (MMICs) composed of a compound semiconductor having a satisfactory high-frequency property are used for RF transmission/reception circuits for transmitting and receiving radio frequency (RF) signals in cell phones.

Among these MMICs, power amplifier modules for amplifying signals for transmission have extremely large electric power consumption. As a recent demand for reducing the electric power consumption in cell phones has increased, MMICs have also been desired to have lower electric power consumption. Accordingly, power amplifier modules having high gain, high power-added efficiency, and low electric power consumption have been desired.

In order to meet such a demand, a junction pseudomorphic high-electron-mobility transistor (JPHEMT), which is a known example of a transistor suitable for high gain and high power-added efficiency, is often used as a field-effect transistor for power amplifier modules.

More specifically, for example, the junction pseudomorphic high-electron-mobility transistor has the following structure. As shown in FIG. 23, a semiconductor layer is provided on a semi-insulating GaAs (gallium arsenide) substrate 110. The semiconductor layer is formed by forming a buffer layer 111 composed of an undoped GaAs film, a channel layer 112 composed of an undoped InGaAs (indium-gallium-arsenide) film, a spacer layer 113 composed of an undoped AlGaAs (aluminum-gallium-arsenide) film, a doping layer 114 composed of an n-type AlGaAs film, and a barrier layer 115 composed of an n-type AlGaAs film, in that order, by epitaxial growth. A buried gate region 116 is provided in the barrier layer 115 directly under a gate electrode-forming area by doping a p-type impurity such as zinc. An insulating film 117 composed of a silicon nitride film or the like is provided on the top surface of the barrier layer 115. An opening 118s for a source electrode, an opening 118d for a drain electrode, and an opening 118g for a gate electrode are provided on the insulating film 117. A source electrode 119s, a drain electrode 119d, and a gate electrode 119g are provided in the opening 118s for a source electrode, the opening 118d for a drain electrode, and the opening 118g for a gate electrode, respectively.

In this junction pseudomorphic high-electron-mobility transistor, in general, the gain characteristic can be improved by decreasing the source parasitic resistance Rs, decreasing the gate resistance Rg, increasing the mutual conductance gm, or decreasing the parasitic capacitance Cgd between the gate and the drain (hereinafter referred to as gate-drain parasitic capacitance Cgd). It is believed that a decrease in the gate-drain parasitic capacitance Cgd is particularly effective.

In order to decrease the gate-drain parasitic capacitance Cgd, the distance Lgd between the gate electrode and the drain electrode may be increased. However, an increase in the distance Lgd between the gate electrode and the drain electrode increases the size of the junction pseudomorphic high-electron-mobility transistor, resulting in an increase in the chip area. Since this is contrary to the demand for miniaturization, the increase in the distance Lgd is not a practical measure. Furthermore, when the distance Lgd between the gate electrode and the drain electrode is increased, the on-resistance of the junction pseudomorphic high-electron-mobility transistor is increased and thus the power-added efficiency may be decreased.

The gate-drain parasitic capacitance Cgd can also be decreased by decreasing a channel concentration, which is the concentration of an impurity doped in the doping layer 114. In this case, however, the source parasitic resistance Rs, which is the resistance between the source and the gate, is increased, and therefore the gain may be decreased. Furthermore, when the channel concentration is decreased, the on-resistance of the junction pseudomorphic high-electron-mobility transistor is increased. Accordingly, the power-added efficiency may be decreased.

Consequently, for example, according to a technique disclosed in Japanese Unexamined Patent Application Publication No. 2003-59947, a recessed part is provided on the top surface of a barrier layer at a position between a gate electrode and a drain electrode so that a part of the barrier layer corresponding to the position of the drain electrode has a small thickness.

SUMMARY OF THE INVENTION

When the thickness of the part of the barrier layer corresponding to the position of the drain electrode is decreased, the sheet resistance and the contact resistance are increased to increase the on-resistance, resulting in a decrease in the power-added efficiency.

In view of the above current situation, the present inventor has conducted intensive studies in order that the gate-drain parasitic capacitance Cgd in a junction pseudomorphic high-electron-mobility transistor is decreased without increasing the chip size and made the present invention.

A field-effect transistor according to an embodiment of the present invention includes a semi-insulating substrate; a source electrode; a drain electrode; a gate electrode, the electrodes being provided on the semi-insulating substrate; and a buried gate region which is provided under the gate electrode and in which an impurity is doped, wherein a concave slit is provided in the semi-insulating substrate, the slit being located between the gate electrode and the drain electrode and being adjacent to the buried gate region at the side of the drain electrode.

A field-effect transistor according to an embodiment of the present invention includes a semi-insulating substrate; a channel layer formed on the semi-insulating substrate by epitaxial growth; a spacer layer formed on the channel layer by epitaxial growth; a doping layer formed on the spacer layer by epitaxial growth; a barrier layer formed on the doping layer by epitaxial growth; a source electrode; a drain electrode; a gate electrode, the electrodes being provided on the barrier layer; and a buried gate region which is provided in the barrier layer and in which an impurity is doped, the buried gate region being disposed under the gate electrode, wherein a concave slit is provided in the barrier layer, the slit being located between the gate electrode and the drain electrode.

The depth of the slit may be in the range of 30% to 70% of the thickness of the barrier layer. The slit may be in contact with the buried gate region. The slit may have a width of 2 μm or less.

A semiconductor device according to an embodiment of the present invention includes a field-effect transistor including a semi-insulating substrate; a source electrode; a drain electrode; a gate electrode, the electrodes being provided on the semi-insulating substrate; and a buried gate region which is provided under the gate electrode and in which an impurity is doped, wherein the field-effect transistor includes a concave slit provided in the semi-insulating substrate, the slit being located between the gate electrode and the drain electrode and being adjacent to the buried gate region at the side of the drain electrode.

A semiconductor device according to an embodiment of the present invention includes a field-effect transistor including a semi-insulating substrate; a channel layer formed on the semi-insulating substrate by epitaxial growth; a spacer layer formed on the channel layer by epitaxial growth; a doping layer formed on the spacer layer by epitaxial growth; a barrier layer formed on the doping layer by epitaxial growth; a source electrode; a drain electrode; a gate electrode, the electrodes being provided on the barrier layer; and a buried gate region which is provided in the barrier layer and in which an impurity is doped, the buried gate region being disposed under the gate electrode, wherein a concave slit is provided in the barrier layer, the slit being located between the gate electrode and the drain electrode of the field-effect transistor.

A method of producing a semiconductor device according to an embodiment of the present invention includes the steps of forming a semiconductor layer on a semi-insulating substrate by epitaxial growth, forming a buried gate region doped with an impurity in the semiconductor layer, forming a gate electrode on the buried gate region, and forming a source electrode and a drain electrode on the semiconductor layer, thereby forming a field-effect transistor, wherein, after the step of forming the semiconductor layer, a concave slit is formed in the semiconductor layer, the slit being located between a gate electrode-forming area where the gate electrode is formed and a drain electrode-forming area where the drain electrode is formed.

The slit may be formed by forming, on the semiconductor layer, a mask for etching having an opening corresponding to the position of the slit to be formed, and etching the semiconductor layer using the mask for etching. In this case, a sidewall may be formed on the inner periphery of the opening of the mask for etching.

According to an embodiment of the present invention, a field-effect transistor includes a semi-insulating substrate; a source electrode; a drain electrode; a gate electrode, the electrodes being provided on the semi-insulating substrate; and a buried gate region which is provided under the gate electrode and in which an impurity is doped, wherein a concave slit is provided in the semi-insulating substrate, the slit being located between the gate electrode and the drain electrode and being adjacent to the buried gate region at the side of the drain electrode. Accordingly, the gate-drain parasitic capacitance can be decreased without increasing the distance between the gate and the drain, and the gain characteristic of the field-effect transistor can be markedly improved.

According to an embodiment of the present invention, a field-effect transistor includes a semi-insulating substrate; a channel layer formed on the semi-insulating substrate by epitaxial growth; a spacer layer formed on the channel layer by epitaxial growth; a doping layer formed on the spacer layer by epitaxial growth; a barrier layer formed on the doping layer by epitaxial growth; a source electrode; a drain electrode; a gate electrode, the electrodes being provided on the barrier layer; and a buried gate region which is provided in the barrier layer and in which an impurity is doped, the buried gate region being disposed under the gate electrode, wherein a concave slit is provided in the barrier layer, the slit being located between the gate electrode and the drain electrode. Accordingly, the gate-drain parasitic capacitance can be decreased without increasing the on-resistance or without increasing the source parasitic resistance, and the gain characteristic of the field-effect transistor can be markedly improved.

In the field-effect transistor according to the embodiment of the present invention, the depth of the slit may be in the range of 30% to 70% of the thickness of the barrier layer. In this case, the gain of the field-effect transistor can be improved while a degradation of the on-resistance is considered.

In the field-effect transistor according to the embodiment of the present invention, the slit may be in contact with the buried gate region. In this case, the gate-drain parasitic capacitance can be further decreased, and the gain characteristic of the field-effect transistor can be further improved.

In the field-effect transistor according to the embodiment of the present invention, the slit preferably has a width of 2 μm or less. In this case, the gain characteristic of the field-effect transistor can be improved while an increase in the on-resistance is suppressed.

According to an embodiment of the present invention, a semiconductor device includes a field-effect transistor including a semi-insulating substrate; a source electrode; a drain electrode; a gate electrode, the electrodes being provided on the semi-insulating substrate; and a buried gate region which is provided under the gate electrode and in which an impurity is doped, wherein the field-effect transistor includes a concave slit provided in the semi-insulating substrate, the slit being located between the gate electrode and the drain electrode and being adjacent to the buried gate region at the side of the drain electrode. Accordingly, in the field-effect transistor, the gate-drain parasitic capacitance can be decreased without increasing the distance between the gate and the drain, and the gain characteristic can be markedly improved. Therefore, a semiconductor device having desired characteristics and low electric power consumption can be provided.

According to an embodiment of the present invention, a semiconductor device includes a field-effect transistor including a semi-insulating substrate; a channel layer formed on the semi-insulating substrate by epitaxial growth; a spacer layer formed on the channel layer by epitaxial growth; a doping layer formed on the spacer layer by epitaxial growth; a barrier layer formed on the doping layer by epitaxial growth; a source electrode; a drain electrode; a gate electrode, the electrodes being provided on the barrier layer; and a buried gate region which is provided in the barrier layer and in which an impurity is doped, the buried gate region being disposed under the gate electrode, wherein a concave slit is provided in the barrier layer, the slit being located between the gate electrode and the drain electrode of the field-effect transistor. Accordingly, in the field-effect transistor, the gate-drain parasitic capacitance can be decreased without increasing the on-resistance or without increasing the source parasitic resistance, and the gain characteristic can be markedly improved. Therefore, a semiconductor device having desired characteristics and low electric power consumption can be provided.

According to an embodiment of the present invention, a method of producing a semiconductor device includes the steps of forming a semiconductor layer on a semi-insulating substrate; forming a buried gate region doped with an impurity in the semiconductor layer; forming a gate electrode on the buried gate region; and forming a source electrode and a drain electrode on the semiconductor layer, thereby forming a field-effect transistor, wherein, after the step of forming the semiconductor layer, a concave slit is formed in the semiconductor layer, the slit being located between a gate electrode-forming area where the gate electrode is formed and a drain electrode-forming area where the drain electrode is formed. Accordingly, in the field-effect transistor, the gate-drain parasitic capacitance can be decreased and the gain characteristic can be markedly improved. Therefore, a semiconductor device having desired characteristics and low electric power consumption can be produced.

In the method of producing a semiconductor device according to the embodiment of the present invention, the slit is preferably formed by forming, on the semiconductor layer, a mask for etching having an opening corresponding to the position of the slit to be formed, and etching the semiconductor layer using the mask for etching. Accordingly, the slit can be formed very easily.

In the method of producing a semiconductor device according to the embodiment of the present invention, a sidewall is preferably formed on the inner periphery of the opening of the mask for etching. Accordingly, a fine slit can be formed. Thus, a semiconductor device can be produced in which the gate-drain parasitic capacitance is further decreased and the gain characteristic of the field-effect transistor is further improved.

DESCRIPTION OF THE PREFERRED EMBODIMENTS

In a field-effect transistor, a semiconductor device including the field-effect transistor, and a method of producing a semiconductor device according to an embodiment of the present invention, a field-effect transistor includes a semi-insulating substrate; a source electrode; a drain electrode; a gate electrode, the electrodes being provided on the semi-insulating substrate; and a buried gate region which is provided under the gate electrode and in which an impurity is doped, wherein a concave slit is provided in the semi-insulating substrate, the slit being located between the gate electrode and the drain electrode and being adjacent to the buried gate region at the side of the drain electrode.

A semiconductor layer is preferably provided on the semi-insulating substrate, and a predetermined semiconductor layer is formed by epitaxial growth or the like. The concave slit is provided on the semiconductor layer at a position between the gate electrode and the drain electrode. An insulator is embedded in the slit by filling the insulator. Thus, a slit in which the insulator is buried is formed.

As described above, the concave slit in which an insulator is buried is provided between the gate electrode and the drain electrode. Consequently, the gate-drain parasitic capacitance can be decreased without increasing the distance between the gate electrode and the drain electrode. Furthermore, the gain characteristic of the field-effect transistor can be markedly improved without increasing the installation area of the field-effect transistor on the semi-insulating substrate.

A field-effect transistor in a semiconductor device according to an embodiment of the present invention will now be described with reference to the drawings.

Figure 1:
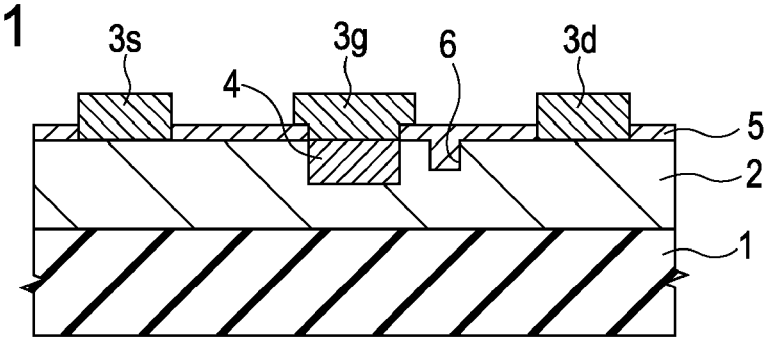
FIG. 1 is a schematic cross-sectional view of a field-effect transistor in a semiconductor device according to an embodiment of the present invention.

As shown in FIG. 1, in the field-effect transistor, a semiconductor layer 2 formed by epitaxial growth is provided on a semi-insulating substrate 1. A gate electrode 3g, a source electrode 3s, and a drain electrode 3d are provided at predetermined positions on the semiconductor layer 2. A buried gate region 4 doped with an impurity is provided in the semiconductor layer 2, the buried gate region 4 being disposed under the gate electrode 3g. A concave slit 6 is provided in the semiconductor layer 2, the slit 6 being located between the gate electrode 3g and the drain electrode 3d. The concave slit 6 is filled with an insulator constituting an insulating layer 5.

Figure 2:
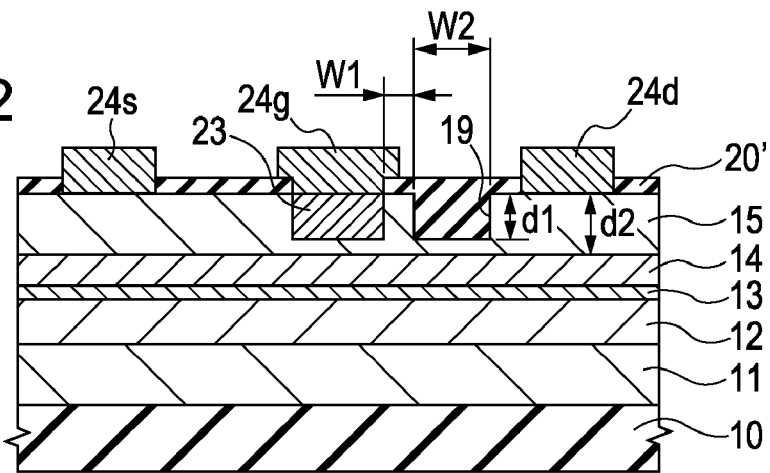
FIG. 2 is a schematic cross-sectional view of a field-effect transistor in a semiconductor device according to an embodiment of the present invention.

In particular, as shown in FIG. 2, when a field effect transistor includes a semi-insulating substrate 10 composed of a gallium arsenide substrate as the semi-insulating substrate 1, a semiconductor layer is formed by sequentially laminating a buffer layer 11, a channel layer 12, a spacer layer 13, a doping layer 14, a barrier layer 15, and an insulating layer 20' on the semi-insulating substrate 10. A gate electrode 24g, a source electrode 24s, and a drain electrode 24d are provided at predetermined positions on the semiconductor layer. A buried gate region 23 doped with an impurity is provided in the barrier layer 15, the buried gate region 23 being disposed under the gate electrode 24g. The width of the buried gate region 23 is less than the width of the gate electrode 24g. A concave slit 19 is provided in the barrier layer 15, the slit 19 being located between the gate electrode 24g and the drain electrode 24d. The concave slit 19 is filled with an insulator constituting the insulating layer 20'.

Figure 3:
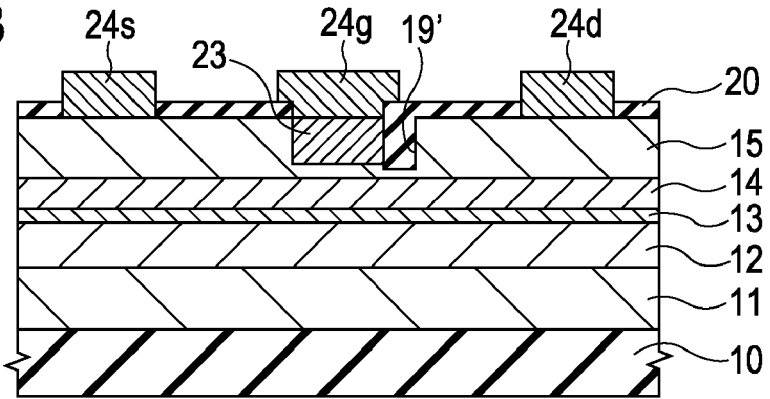
FIG. 3 is a schematic cross-sectional view of a field-effect transistor in a semiconductor device according to an embodiment of the present invention.

In the field-effect transistor shown in FIG. 2, the slit 19 is provided in the barrier layer 15 at a half-way position between the gate electrode 24g and the drain electrode 24d. Alternatively, as shown in FIG. 3, a slit 19' may be provided so as to be in contact with the buried gate region 23.

Figure 4:
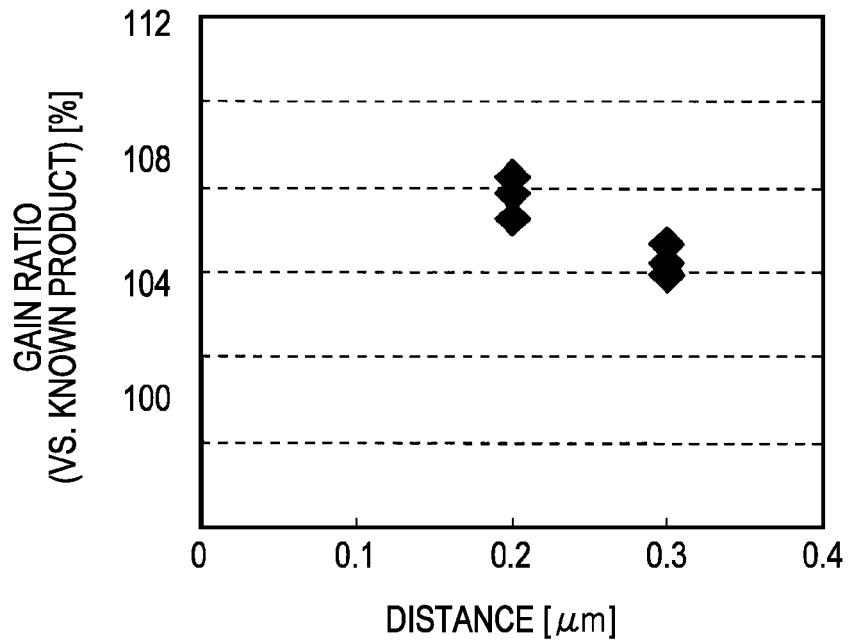
FIG. 4 is a graph showing the relationship between the distance from a buried gate region to a slit and the gain ratio.

FIG. 4 is a graph showing the relationship between the distance w1 from the buried gate region 23 to the slit 19 or 19' and the gain ratio. From the standpoint of power gain, the slit 19 or 19' is preferably disposed so that the slit 19 or 19' is as close to the buried gate region 23 as possible.

Figure 5:
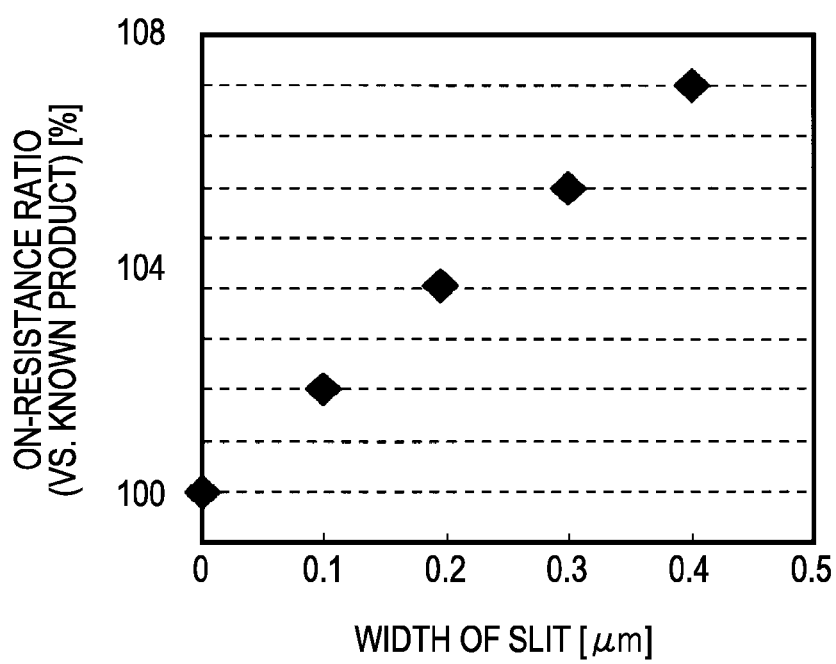
FIG. 5 is a graph showing the relationship between the width of the slit and the on-resistance ratio.

FIG. 5 is a graph showing the relationship between the width w2 of the slit 19 or 19' and the on-resistance ratio. The graph shows that a smaller width w2 of the slit 19 or 19' is preferred. Accordingly, the width w2 of the slit 19 or 19' is preferably minimized.

Figure 6:
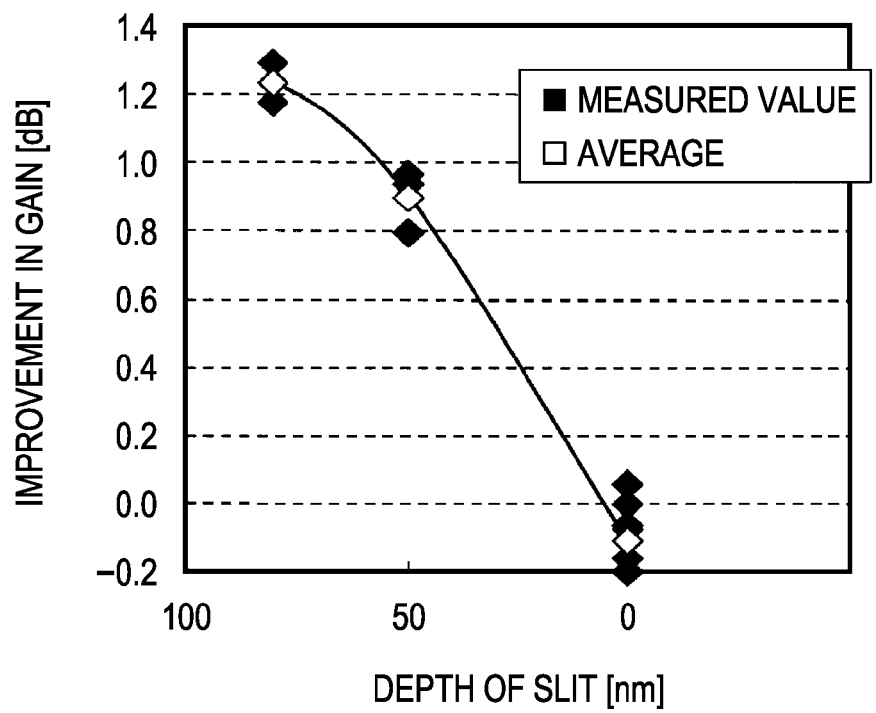
FIG. 6 is a graph showing the relationship between the depth of the slit and the gain improvement ratio.

FIG. 6 is a graph showing the relationship between the depth d1 of the slit 19 or 19' and the gain improvement ratio (dB) in the case where the thickness d2 of the barrier layer 15 is 100 nm. The graph shows that a deeper depth d1 of the slit 19 or 19' is preferred. More specifically, the slit 19 or 19' is preferably disposed so that the slit 19 or 19' is as close to the doping layer 14 as possible. However, if the slit 19 or 19' reaches the doping layer 14, characteristics of the field-effect transistor are significantly degraded. Therefore, the slit 19 or 19' is provided so as not to reach the doping layer 14.

Figure 7:
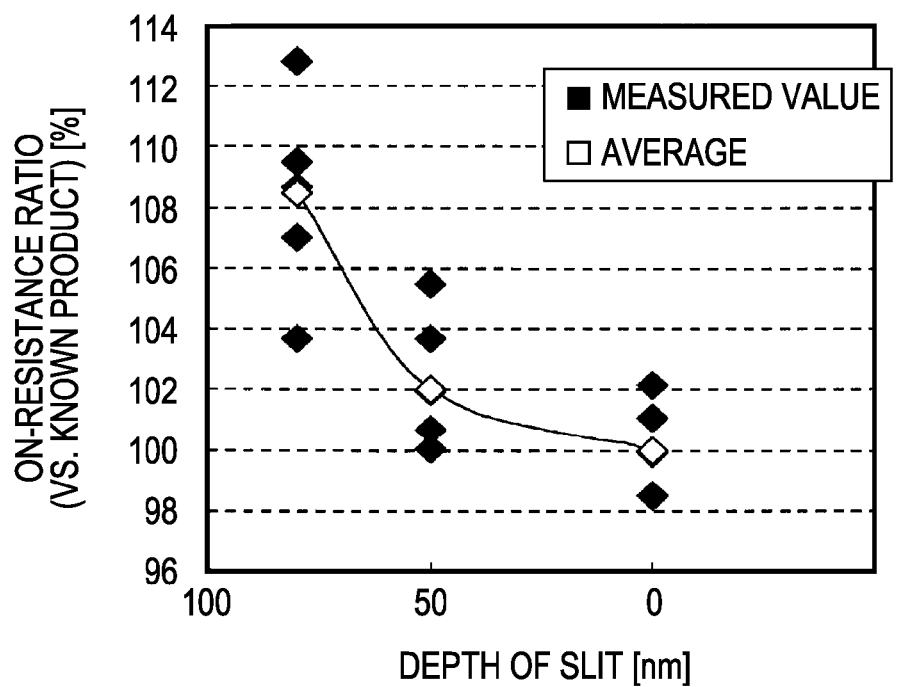
FIG. 7 is a graph showing the relationship between the depth of the slit and the on-resistance ratio.

FIG. 7 is a graph showing the relationship between the depth d1 of the slit 19 or 19' and the on-resistance ratio in the case where the thickness d2 of the barrier layer 15 is 100 nm. The graph shows that a shallower depth d1 of the slit 19 or 19' is preferred. That is, the slit 19 or 19' is preferably disposed so that the slit 19 or 19' is as far from the doping layer 14 as possible.

As described above, regarding the depth of the slit 19 or 19', from the standpoint of improving the gain characteristic, the distance between the doping layer 14 and the bottom of the slit 19 or 19' is preferably small. On the other hand, from the standpoint of the on-resistance, when the distance between the doping layer 14 and the bottom of the slit 19 or 19' is excessively small, the characteristics of the field-effect transistor may be degraded. The on-resistance of the field-effect transistor is a parameter that affects the power-added efficiency, which is a performance index, and is preferably as low as possible. Consequently, considering the trade-off relationship between the improvement in the gain and an increase in the on-resistance, the depth of the slit 19 or 19' is preferably in the range of about 30% to 70% of the thickness of the barrier layer 15.

A method of producing a field-effect transistor of this embodiment will now be described in detail.

Figure 8:
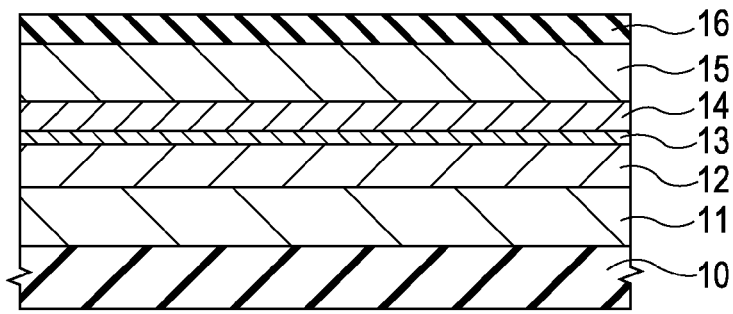
FIG. 8 is a schematic cross-sectional view illustrating a step of producing a field-effect transistor in a semiconductor device according to an embodiment of the present invention.

The field-effect transistor of this embodiment includes a semi-insulating substrate 10 composed of a GaAs (gallium arsenide) substrate. As shown in FIG. 8, a semiconductor layer is formed by epitaxial growth on the top surface of the semi-insulating substrate 10 by sequentially laminating a buffer layer 11 composed of an undoped GaAs film having a thickness of about 500 nm, a channel layer 12 composed of an undoped InGaAs (indium-gallium-arsenide) film having a thickness of about 20 nm, a spacer layer 13 composed of an undoped AlGaAs (aluminum-gallium-arsenide) film having a thickness of about 10 nm, a doping layer 14 composed of an n-type AlGaAs film, and a barrier layer 15 composed of an n-type AlGaAs film having a thickness of about 100 nm.

After the formation of the barrier layer 15, a first insulating layer 16 composed of a silicon nitride film is formed on the top surface of the barrier layer 15 by, for example, chemical vapor deposition (CVD).

Figure 9:
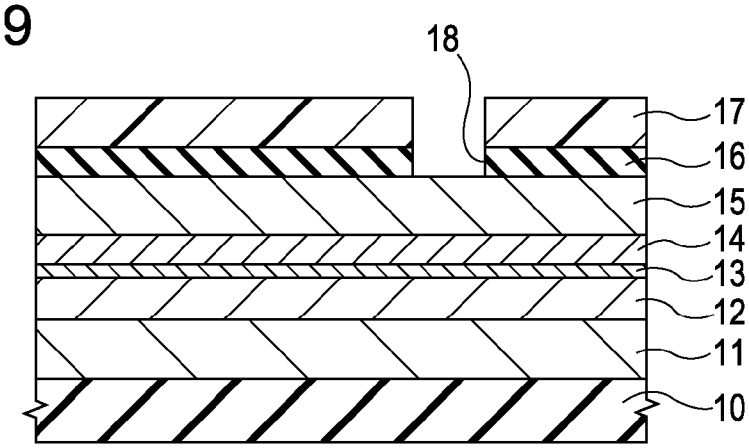
FIG. 9 is a schematic cross-sectional view illustrating a step of producing the field-effect transistor in the semiconductor device according to the embodiment of the present invention.

A resist is then applied on the semi-insulating substrate 10 to form a first resist mask 17 in which a part of the area between an area where the gate of the field-effect transistor is formed and an area where the drain thereof is formed is opened. As shown in FIG. 9, the first insulating layer 16 is then etched using the first resist mask 17 to form an opening 18 for a slit.

Figure 10:
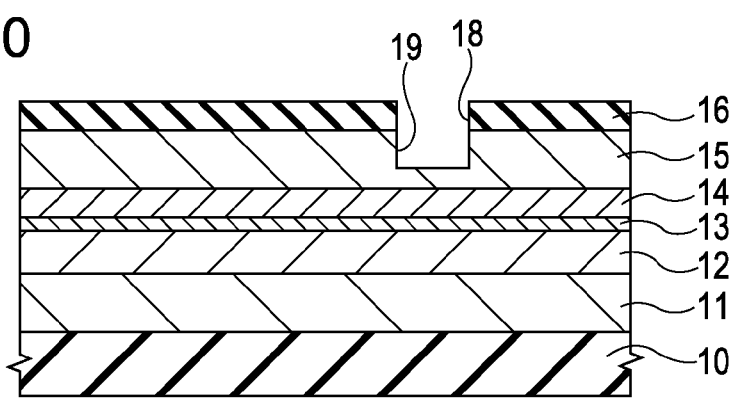
FIG. 10 is a schematic cross-sectional view illustrating a step of producing the field-effect transistor in the semiconductor device according to the embodiment of the present invention.

The first resist mask 17 is then removed. Subsequently, the barrier layer 15 is etched using the first insulating layer 16, which has the opening 18 for a slit, as a mask by wet etching with a mixture of citric acid and aqueous hydrogen peroxide or dry etching such as reactive ion etching (RIE). As shown in FIG. 10, a slit 19 is formed in the barrier layer 15.

Figure 11:
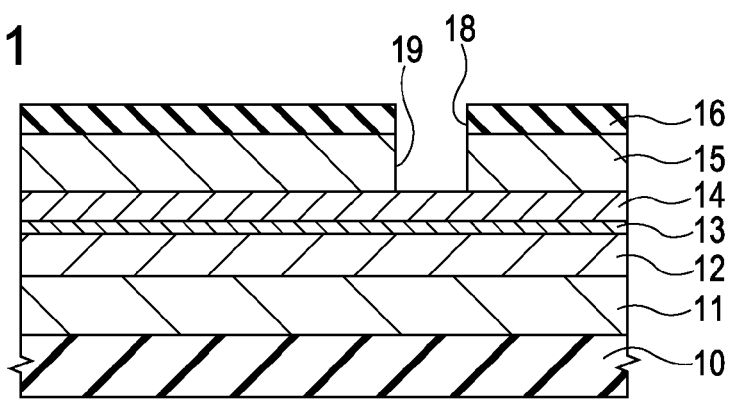
FIG. 11 is a schematic cross-sectional view of a modification of the field-effect transistor.

The depth of the slit 19 is preferably in the range of 30% to 70% of the thickness of the barrier layer 15. The slit 19 should not be in contact with the doping layer 14, but the distance between the bottom of the slit 19 and the doping layer 14 may be minimized, as shown in a modification in FIG. 11. By forming the slit 19 so as to be very close to the doping layer 14, the gate-drain parasitic capacitance can be minimized.

Figure 12:
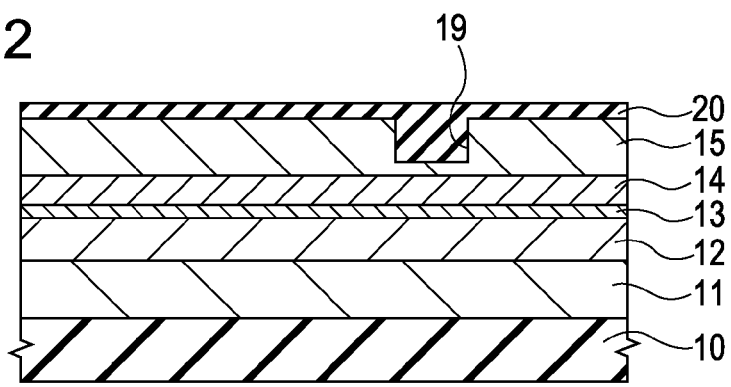
FIG. 12 is a schematic cross-sectional view illustrating a step of producing the field-effect transistor in the semiconductor device according to the embodiment of the present invention.

After the formation of the slit 19, the first insulating layer 16 is removed. As shown in FIG. 12, a second insulating layer 20 composed of a silicon nitride film is formed on the top surface of the barrier layer 15 by, for example, CVD. By forming this second insulating layer 20, the slit 19 is filled with the insulator.

Figure 13:
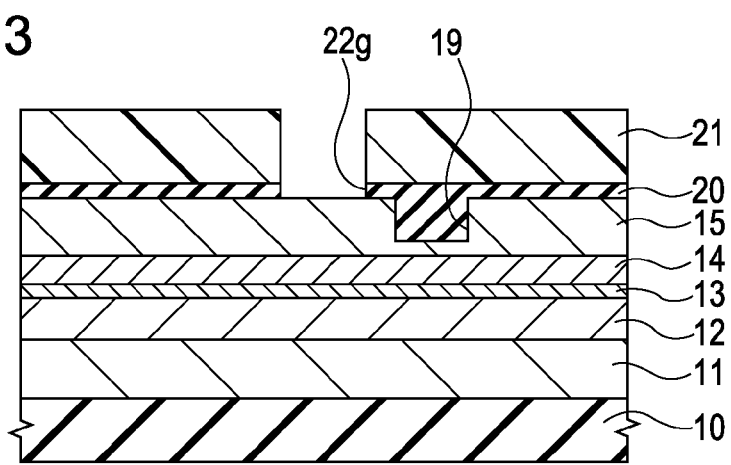
FIG. 13 is a schematic cross-sectional view illustrating a step of producing the field-effect transistor in the semiconductor device according to the embodiment of the present invention.

A resist is then applied on the top surface of the second insulating layer 20 to form a second resist mask 21 in which an area where the gate of the field-effect transistor is formed is opened. The second insulating layer 20 is then etched by RIE using the second resist mask 21. Accordingly, as shown in FIG. 13, an opening 22g for a gate electrode is formed.

Figure 14:
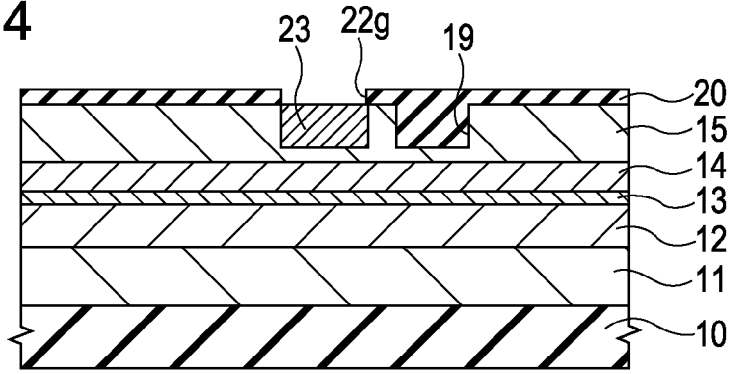
FIG. 14 is a schematic cross-sectional view illustrating a step of producing the field-effect transistor in the semiconductor device according to the embodiment of the present invention.

After the formation of the opening 22g for a gate electrode, the second resist mask 21 is removed. Zinc (Zn) is then introduced into the barrier layer 15 from the opening 22g for a gate electrode using diethyl zinc (DEZ), which is an organometallic compound of Zn, by gas-phase diffusion. Accordingly, as shown in FIG. 14, a p-type buried gate region 23 is formed.

Figure 15:
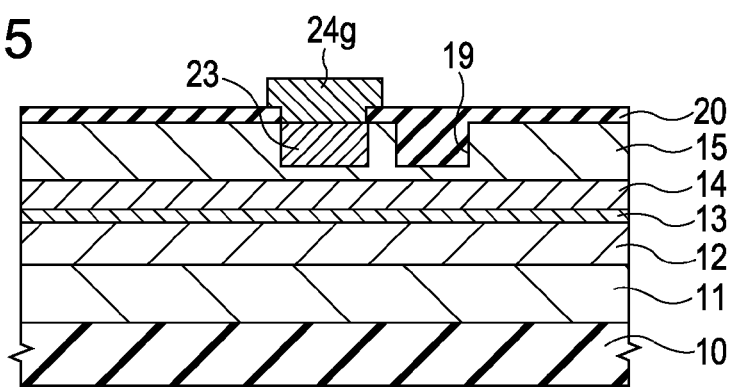
FIG. 15 is a schematic cross-sectional view illustrating a step of producing the field-effect transistor in the semiconductor device according to the embodiment of the present invention.

After the formation of the buried gate region 23, a gate electrode film made of titanium (Ti), platinum (Pt), gold (Au), and the like is deposited on the second insulating layer 20 so as to cover the opening 22g for a gate electrode. The gate electrode film is then patterned by photolithography and milling to form a gate electrode 24g as shown in FIG. 15. This gate electrode 24g is connected to the buried gate region 23 through the opening 22g for a gate electrode.

After the formation of the gate electrode 24g, a resist is applied on the top surface of the second insulating layer 20 to form a resist mask (not shown) in which an area where the source of the field-effect transistor is formed and an area where the drain thereof is formed are opened. The second insulating layer 20 is then etched by RIE using the resist mask. Accordingly, an opening for a source electrode and an opening for a drain electrode are formed in the second insulating layer 20.

Subsequently, a gold-germanium alloy (AuGe), nickel (Ni), and gold (Au) are sequentially evaporated on the barrier layer 15 through the opening for a source electrode and the opening for a drain electrode. As shown in FIG. 2, a source electrode 24s and a drain electrode 24d are then formed by a lift-off method and a subsequent alloying process.

In this embodiment, the field-effect transistor is a single-heterojunction device. Alternatively, the field-effect transistor may be a double-heterojunction device. In such a case, a slit is similarly formed in the barrier layer, thereby decreasing the gate-drain parasitic capacitance.

A method of producing a field-effect transistor of another embodiment will now be described in detail. In the field-effect transistor of this embodiment, the slit has a smaller width. In the following description, components having the same structures as those in the above-described embodiment are assigned the same reference numerals.

The field-effect transistor of this embodiment also includes a semi-insulating substrate 10 composed of a GaAs (gallium arsenide) substrate. As shown in FIG. 8, a semiconductor layer is formed by epitaxial growth on the top surface of the semi-insulating substrate 10 by sequentially laminating a buffer layer 11 composed of an undoped GaAs film having a thickness of about 500 nm, a channel layer 12 composed of an undoped InGaAs (indium-gallium-arsenide) film having a thickness of about 20 nm, a spacer layer 13 composed of an undoped AlGaAs (aluminum-gallium-arsenide) film having a thickness of about 10 nm, a doping layer 14 composed of an n-type AlGaAs film, and a barrier layer 15 composed of an n-type AlGaAs film having a thickness of about 100 nm.

After the formation of the barrier layer 15, a first insulating layer 16 composed of a silicon nitride film is formed on the top surface of the barrier layer 15 by, for example, CVD.

Figure 16:
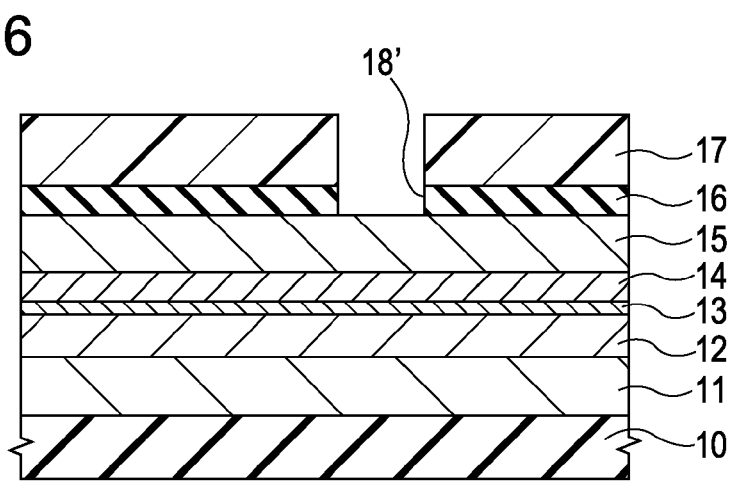
FIG. 16 is a schematic cross-sectional view illustrating a step of producing a field-effect transistor in a semiconductor device according to another embodiment of the present invention.

A resist is then applied on the semi-insulating substrate 10 to form a first resist mask 17 in which a part of the area between an area where the gate of the field-effect transistor is formed and an area where the drain thereof is formed is opened. As shown in FIG. 16, the first insulating layer 16 is then etched using the first resist mask 17 to form an opening 18' for a slit.

Figure 17:
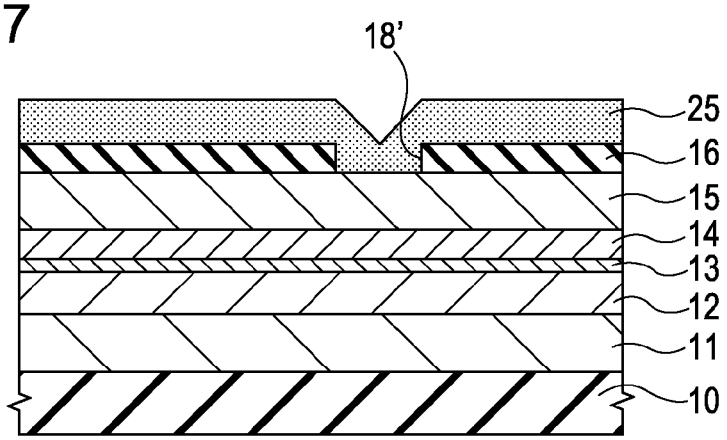
FIG. 17 is a schematic cross-sectional view illustrating a step of producing the field-effect transistor in the semiconductor device according to the embodiment of the present invention.

The first resist mask 17 is then removed. As shown in FIG. 17, an insulating layer 25 for forming a sidewall, the insulating layer 25 being composed of a silicon nitride film, is formed on the top surface of the first insulating layer 16 by CVD.

Figure 18:
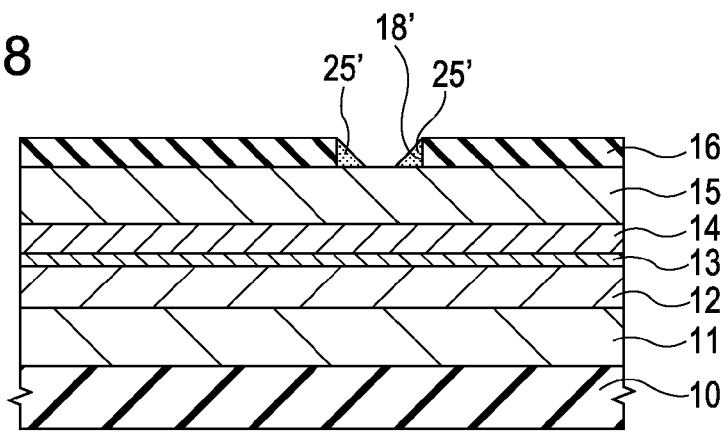
FIG. 18 is a schematic cross-sectional view illustrating a step of producing the field-effect transistor in the semiconductor device according to the embodiment of the present invention.

Subsequently, the insulating layer 25 for forming a sidewall is removed by etching until the barrier layer 15 in the opening 18' for a slit is exposed. Accordingly, as shown in FIG. 18, a sidewall 25' is formed on the inner periphery of the opening 18' for a slit provided in the first insulating layer 16 serving as a mask for etching.

Figure 19:
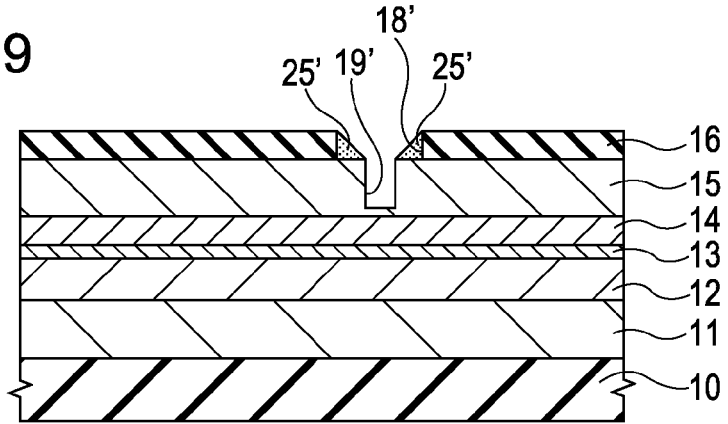
FIG. 19 is a schematic cross-sectional view illustrating a step of producing the field-effect transistor in the semiconductor device according to the embodiment of the present invention.

Subsequently, the barrier layer 15 is etched using the first insulating layer 16 as the mask for etching by wet etching with a mixture of citric acid and aqueous hydrogen peroxide or dry etching such as RIE. As shown in FIG. 19, a slit 19' is formed in the barrier layer 15.

Since the sidewall 25' is formed on the inner periphery of the opening 18' for a slit, the width of the slit 19' to be formed can be decreased, and thus a fine slit can be easily formed.

Figure 20:
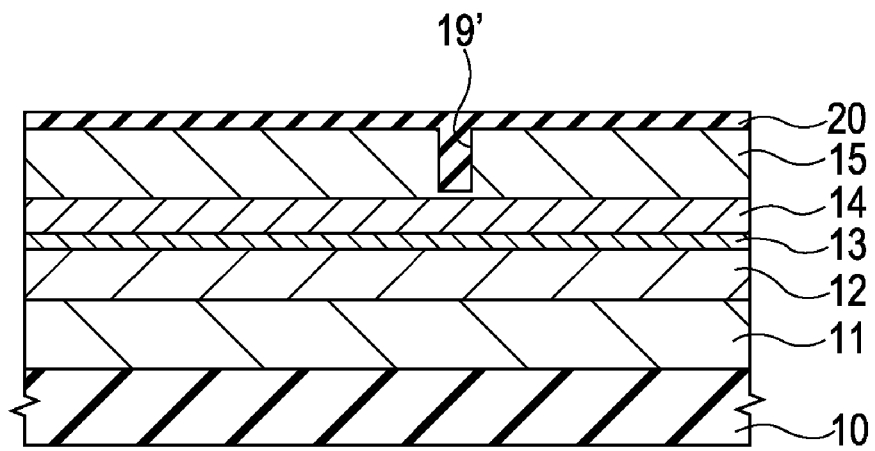
FIG. 20 is a schematic cross-sectional view illustrating a step of producing the field-effect transistor in the semiconductor device according to the embodiment of the present invention.

After the formation of the slit 19', the sidewall 25' is removed together with the first insulating layer 16. As shown in FIG. 20, a second insulating layer 20 composed of a silicon nitride film is formed on the top surface of the barrier layer 15 by, for example, CVD. By forming this second insulating layer 20, the slit 19' is filled with the insulator.

Figure 21:
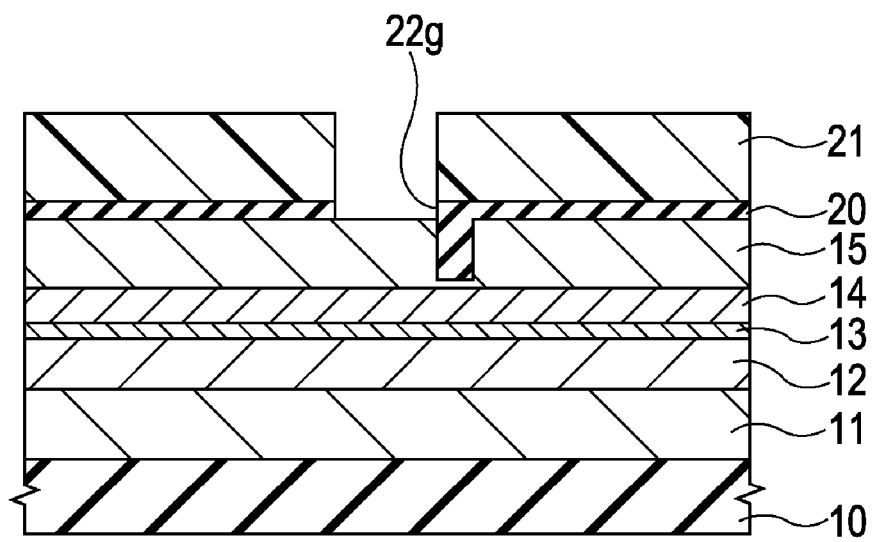
FIG. 21 is a schematic cross-sectional view illustrating a step of producing the field-effect transistor in the semiconductor device according to the embodiment of the present invention.

A resist is then applied on the top surface of the second insulating layer 20 to form a second resist mask 21 in which an area where the gate of the field-effect transistor is formed is opened. The second insulating layer 20 is then etched by RIE using the second resist mask 21. Accordingly, as shown in FIG. 21, an opening 22g for a gate electrode is formed.

Figure 22:
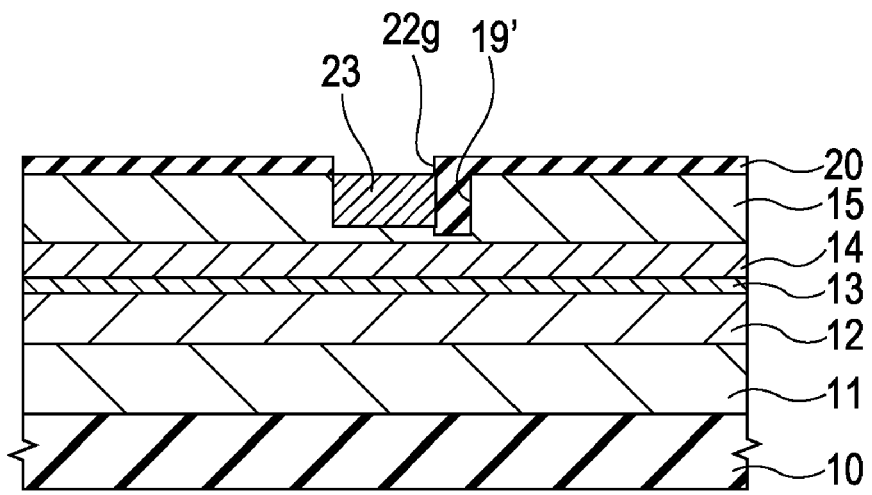
FIG. 22 is a schematic cross-sectional view illustrating a step of producing the field-effect transistor in the semiconductor device according to the embodiment of the present invention.
Figure 23:
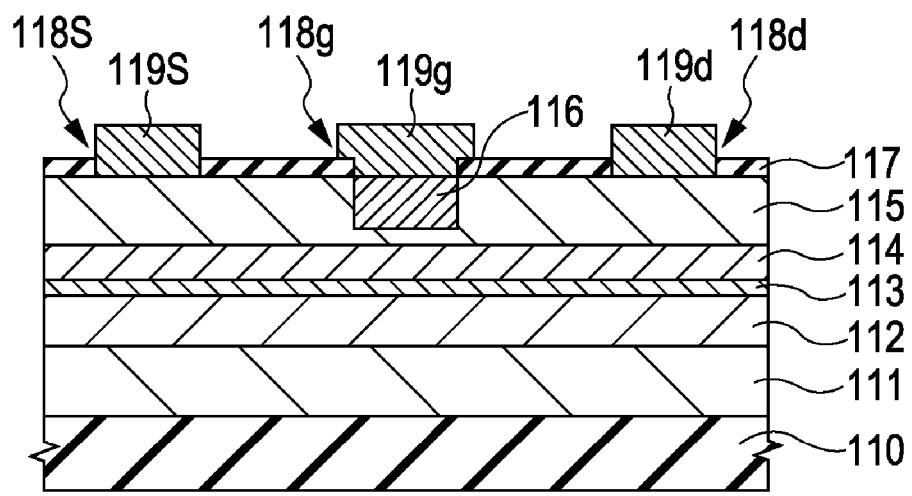
FIG. 23 is a schematic cross-sectional view of a known field-effect transistor in a semiconductor device.

After the formation of the opening 22g for a gate electrode, the second resist mask 21 is removed. Zinc (Zn) is then introduced into the barrier layer 15 from the opening 22g for a gate electrode using diethyl zinc (DEZ), which is an organometallic compound of Zn, by gas-phase diffusion. Accordingly, as shown in FIG. 22, a p-type buried gate region 23 is formed.

The opening 18' for a slit provided in the first insulating layer 16 is formed so that the opening 18' is as close to the area where the buried gate region 23 is formed as possible. Accordingly, the slit 19' can be arranged so as to be close to the buried gate region 23.

Since the steps after the formation of the buried gate region 23 are the same as those of the above-described embodiment, the description is omitted. A gate electrode 24g, a source electrode 24s, and a drain electrode 24d are formed to produce the field-effect transistor shown in FIG. 3.

It should be understood by those skilled in the art that various modifications, combinations, sub-combinations and alterations may occur depending on design requirements and other factors insofar as they are within the scope of the appended claims or the equivalents thereof.

What is claimed is:
1. A junction pseudomorphic high-electron-mobility transistor comprising:
  a semi-insulating substrate;
  a doping layer located on the substrate;
  a n-type barrier layer over said doping layer;

a source electrode, a drain electrode, and a gate electrode on said barrier layer, the electrodes being provided at approximately the same distance from the semi-insulating substrate;

a buried gate region under the gate electrode and in which an impurity is doped, the buried gate region being formed in the barrier layer; and a slit in the barrier layer, the slit located between the buried gate region and the drain electrode and filled with an insulating material, wherein, the slit extends from the surface of the barrier layer towards the doping layer to a depth of between 30% to 70% of the thickness of the barrier layer, the depth of the slit extending at approximately the same amount or more than a depth of the buried gate region, and a width of the buried gate region relative to a direction between the source and drain electrodes is less than a width of the gate electrode.

2. A junction pseudomorphic high-electron-mobility transistor comprising:

a semi-insulating substrate;

a channel layer formed on the semi-insulating substrate by epitaxial growth;

a spacer layer formed on the channel layer by epitaxial growth;

a doping layer formed on the spacer layer by epitaxial growth;

an n-type barrier layer formed on the doping layer by epitaxial growth;

a source electrode;

a drain electrode;

a gate electrode, the electrodes at approximately the same height on the barrier layer;

a buried gate region in the barrier layer and in which an impurity is doped, the buried gate region being disposed under the gate electrode; and a slit in the barrier layer, the slit located between the buried gate region and the drain electrode and filled with an insulating material, wherein, a width of the buried gate region relative to a direction between the source and drain electrodes is less than a width of the gate electrode, and the slit extends from the surface of the barrier layer towards the doping layer to a depth of between 30% to 70% of the thickness of the barrier layer without contacting the doping layer, the depth of the slit extending into the barrier layer at approximately the same amount or more than a depth of the buried gate region.

3. The transistor according to claim 2, wherein the slit has a width of 2 μm or less.

4. A semiconductor device comprising:

a junction pseudomorphic high-electron-mobility transistor including a semi-insulating substrate;

a doping layer located on the substrate;

a n-type barrier layer on said doping layer;

a source electrode, a drain electrode, a gate electrode on said barrier layer, the electrodes being provided at approximately the same distance from the semi-insulating substrate;

a buried gate region under the gate electrode and in which an impurity is doped, the buried gate region being formed in the barrier layer; and the transistor includes a slit in the barrier layer, the slit located between the buried gate region and the drain electrode filled with an insulating material, wherein, the width of the buried gate region relative to a direction between the source and drain electrodes is less than the width of the gate electrode, and the slit extends from the surface of the n-type barrier layer towards the doping layer at a depth of between 30% to 70% of the thickness of the n-type barrier layer without contacting the doping layer, the depth of the slit extending at approximately the same amount or more than a depth of the buried gate region.

5. A semiconductor device comprising:

a junction pseudomorphic high-electron-mobility transistor including a semi-insulating substrate;

a channel layer formed on the semi-insulating substrate by epitaxial growth;

a spacer layer formed on the channel layer by epitaxial growth;

a doping layer formed on the spacer layer by epitaxial growth;

an n-type barrier layer formed on the doping layer by epitaxial growth;

a source electrode, a drain electrode, a gate electrode on the barrier layer, the electrodes being provided at approximately the same distance from the barrier layer; and a buried gate region in the barrier layer and in which an impurity is doped, the buried gate region being disposed under the gate electrode; and a slit in the barrier layer, the slit located between the buried gate region and the drain electrode filled with insulating material, wherein, the width of the buried gate region relative to a direction between the source and drain electrodes is less than the width of the gate electrode, and the slit extends from the surface of the n-type barrier layer towards the doping layer at a depth of between 30% to 70% of the thickness of the n-type barrier layer without contacting the doping layer, the depth of the slit extending at approximately the same amount or more than a depth of the buried gate region.

6. The semiconductor device according to claim 5, wherein the slit has width of 2 μm or less.

7. A method of producing a semiconductor device comprising the steps of:

forming a doping layer on a semi-insulating substrate;

forming an n-type semiconductor layer on the doping layer;

forming a slit in the n-type semiconductor layer, the slit located between the buried gate region and a drain electrode filled with insulating material;

forming a buried gate region doped with an impurity in the n-type semiconductor layer;

forming a gate electrode on the buried gate region; and forming a source electrode and a drain electrode at approximately the same height as the gate electrode on the n-type semiconductor layer, thereby forming a junction pseudomorphic high-electron-mobility transistor, wherein, the width of the buried gate region relative to a direction between the source and drain electrodes is less than the width of the gate electrode, and the slit extends from the surface of the n-type semiconductor layer towards the doping layer at a depth of between 30% to 70% of the thickness of the n-type semiconductor layer without contacting the doping layer, the depth of the slit extending at approximately the same amount or more than a depth of the buried gate region.

8. The method of producing a semiconductor device according to claim 7, wherein the slit is formed by forming, on the n-type semiconductor layer, a mask for etching having an opening corresponding to the position of the slit to be formed, and etching the n-type semiconductor layer using the mask for etching.

9. The method of producing a semiconductor device according to claim 8, wherein a sidewall is formed on the inner periphery of the opening of the mask for etching.

* * * * *